United States Patent [19]
Li et al.

[11] Patent Number: 5,850,091
[45] Date of Patent: Dec. 15, 1998

[54] SEMICONDUCTOR MEMORY DEVICE AND METHOD OF READING A DATA THEREFROM

[75] Inventors: Akira Li; Yutaka Hayashi; Akihiro Nakamura, all of Kanagawa, Japan

[73] Assignee: Sony Corporation, Japan

[21] Appl. No.: 755,223

[22] Filed: Nov. 25, 1996

[30] Foreign Application Priority Data

Nov. 27, 1995 [JP] Japan ................................... 7-307988
Sep. 26, 1996 [JP] Japan ................................... 8-255045

[51] Int. Cl.$^6$ .................................................. H01L 29/00
[52] U.S. Cl. ........................ 257/316; 257/315; 257/317; 257/319
[58] Field of Search .................................. 257/316, 317, 257/319

[56] References Cited

U.S. PATENT DOCUMENTS

| | | | |
|---|---|---|---|
| 5,388,065 | 2/1995 | Yoneda | 365/49 |
| 5,397,725 | 3/1995 | Wolstenholme et al. | 257/316 |
| 5,409,854 | 4/1995 | Bergemont | 437/43 |
| 5,548,146 | 8/1996 | Kuroda et al. | 257/316 |
| 5,587,948 | 12/1996 | Nakai | 365/185.17 |
| 5,589,699 | 12/1996 | Araki | 357/316 |
| 5,596,527 | 1/1997 | Tomioka et al. | 365/185.2 |
| 5,627,779 | 5/1997 | Odake et al. | 257/316 |
| 5,637,895 | 6/1997 | Iwata et al. | 357/315 |

*Primary Examiner*—Valencia Wallace
*Attorney, Agent, or Firm*—Ronald P. Kananen

[57] ABSTRACT

A semiconductor memory device wherein source lines of a memory cell array constituted by a plurality of memory cells arranged in the form of a matrix at intersecting points of word lines and bit lines are arranged in a row direction or a column direction and the source lines of the nonselected rows or the nonselected columns are inversely biased with respect to the semiconductor substrate, thereby to prevent erroneous reading by the leakage current at the time of reading data and further reduce the write current at the time of writing. Further, the read operation is kept from deteriorating by reducing the amplitude of the source line at the time of reading by setting the inverse bias voltage at a minimum constant voltage smaller than the power source voltage.

22 Claims, 10 Drawing Sheets

SEMICONDUCTOR MEMORY DEVICE AND METHOD OF READING A DATA THEREFROM

BACKGROUND OF THE INVENTION

1. Field of the Invention

The present invention relates to a semiconductor memory device having a memory transistor comprising an insulating gate field effect transistor provided with a charge storing means between a control gate and a channel-forming region and to a method of reading a data therefrom.

2. Description of the Related Art

An electrically erasable and programmable read only memory (EEFROM) in which the charging and discharging of a charge storing layer just beneath a control gate are electrically controlled by a control gate has been frequently used as a memory transistor.

Among them, as a representative one, there is an insulating gate field effect transistor (hereinafter referred to as an "FG type memory transistor") having a conductive floating gate as the charge storing layer.

On the other hand, metal-nitride-oxide-semiconductor (MNOS) type and metal-oxide-nitride-oxide-semiconductor (MONOS) type EEPROMs utilizing the interface trap of an oxide film and nitride film as the charge storing layer have been known.

Where these MNOS type and MONOS type transistors are used as memory transistors, since the number of charge traps is finite and the amount of the stored charge is stable, compared with the FG type, such transistors show excellent characteristics such as small fluctuation of the programmed threshold voltage, the resistance of the stored charges to passage through any pin holes or the like in a thin gate oxide film, and the excellent charge retention.

Further, from a similar viewpoint, in recent years, a new mode of an EEPROM utilizing a substance having a small conductivity, though not a complete insulating substance, as the charge storing means has appeared. For example, there is known a proposal for dispersing a large number of fine particle size conductors made of for example silicon on a gate oxide film, covering this from the top by an oxide film, embedding the same in an insulating film, and utilizing the fine particle size conductors as the charge storing means (hereinafter referred to as a "fine particle size conductor type"). Such a conductor, that is, the charge storing means, does not have conductivity as an entire surface.

In addition to this, there is known a proposal for arranging an insulating film such as cerium oxide on a channel-forming region, stacking a ferroelectric film having at least two opposed surfaces and a control gate on this insulating film, and using the insulating film as the charge storing layer (hereinafter referred to as a "ferroelectric type"). In this ferroelectric type, the charges are induced on the surfaces of the ferroelectric film in accordance with the direction of polarization of the ferroelectric film, therefore the conductivity across the film will be considerably limited at the time of at least the retention of the charge.

For example, for the MONOS type, it has also been proposed to make use of the above characteristic to make the gate oxide film thinner and make a type of dynamic random-access memory (DRAM) capable of high speed random writing (about 100 nsec in actual circumstances) and random erasure of data by a MONOS type transistor (hereinafter referred to as a "DRAM type").

Note that, in this case, although the amount of the stored charge is small, amplification of the stored information by the transistor structure (gain cell) compensates for the drawback. Also, the charge retention characteristic is abruptly deteriorated along with the reduction of the thickness of the gate oxide film. However, the transistors are still to be used as a kind of DRAM as far as the retention time is concerned.

In this way, various memory transistors of the type electrically controlling the charge storing means under the control gate, including EEPROMs, have been realized or proposed.

Note that, below, the EEPROM of the FG type will be referred to as the "preceding type" and the MNOS type not having conductivity or having an extremely small conductivity, the MONOS type, the fine particle size conductor type, the ferroelectric type not having conductivity at least at the time of holding a charge, and the DRAM type using these like a DRAM will be referred to as the "new type".

The preceding type (FG type) of memory transistor has a large charge storage capability and accordingly has been operated in only the enhancement mode, but the miniaturization of the elements results in a leakage current becoming apt to flow through the nonselected transistors and an increase of the current consumption and furthermore, erroneous readings due to the leakage current.

On the other hand, in the case of "new type" memory transistors such as the MNOS type and MONOS type in which the charge storing layer does not have conductivity or has an extremely small conductivity or the fine particle size conductor type or ferroelectric type and DRAM type using them like a DRAM, the amount of the stored charge cannot be increased that much, therefore it is necessary to make the threshold voltage Vth lower, perform the operation up to the depletion mode, and ensure a large amount of shift of the Vth with respect to the charge.

For this reason, it has been proposed to apply a negative voltage to the control gates of the nonselected memory transistors at the time of reading data to prevent the erroneous reading due to the current flowing through the nonselected transistors.

While this method can be applied to the preceding FG type of memory transistor having a relatively thick gate insulating film, the application of this method to the other new types of memory transistors has been difficult since the so-called gate disturbance is large, that is, since a negative voltage would be applied to the control gate whenever some stored data connected to the bit line was read, the stored charge would leak and the stored data would weaken.

SUMMARY OF THE INVENTION

An object of the present invention is to provide a semiconductor memory device and a method of reading a data therefrom with which an increase of the current of the nonselected transistors can be prevented and where the memory transistor is operated in the depletion mode, the erroneous reading of data can be effectively prevented without causing a gate disturbance or an increase of the cell surface area due to addition of a select transistor to the cell.

Another object of the present invention is to provide a method of reading a data from the semiconductor memory device.

The semiconductor memory device according to the present invention is a semiconductor memory device in which a plurality of memory elements are arranged in the form of a matrix, gates of the memory elements of the same row are connected to a common word line, sources of the adjoining memory elements in one direction, either the row or column, are connected to a common source line, and drains of the memory elements of the same column are connected to a common bit line, characterized in that a source line driving means is provided for driving the source line.

As the source line driving means, there is a serially connected circuit of a constant potential drop means and a switch means which becomes conductive only at the time of reading of data and becomes nonconductive at the writing of data between, for example, the source line and reference potential line.

Further, the source line driving means can be constituted by an inverter circuit with an input node connected to the word line and an output node connected to the source line.

Further concretely describing this, it is also possible to constitute the constant potential drop means by a junction type diode. Further, it is also possible to constitute the constant potential drop means by an insulating gate type field effect transistor with a source which is grounded, the drain and the gate connected, and the connection point thereof connected to the switch means.

According to the present invention, the gates of the memory elements connected as described above are driven by a common word line, and the sources of the memory elements are driven by a common source line to which the inverted signal of the signal applied to the word lines of the same row is applied. Further, the drains of the memory elements arranged in the same column are driven by a common bit line.

At the time of writing, a high voltage is applied to the selected word line, a reference voltage is applied to the other word lines, a high voltage is applied to the selected bit line as well, and the reference voltage is applied to the nonselected bit lines. Due to the source line driving means of the present invention, the source line of the selected row is held at the reference potential, while the nonselected source lines are raised to the power source voltage. By this, the voltage applied between the sources and the drains of the nonselected transistors is lowered and an effect similar to the shift of the voltage applied between the source and gate to the negative side is obtained, the formation of a channel becomes hard by this, and the generation of current by a capacitive coupling between the drain and the floating gate is suppressed.

This function is basically similar at the time of reading as well. Even when the threshold value of the memory transistor becomes low due to excessive erasing or the like, the source line to which the selected memory element is connected is held at the reference potential by the source line driving means, while the nonselected source lines are raised to the power supply potential, therefore the generation of leakage current at the nonselected transistors is suppressed and malfunctions in the reading operation are effectively prevented.

Further, at the time of reading, since the source lines of the nonselected memory elements are held at a constant potential set by the constant potential drop means, other than the prevention of erroneous reading by the nonselected transistors, an increase of speed of the reading operation of the selected transistor having the source line held at the constant potential can be achieved.

In order to achieve the mode of operation and effect of the present invention, it is not always necessary to use the inverted signal of the word line signal as previously mentioned. Essentially, a similar mode of operation and effect may be obtained by inversely biasing the source region with respect to the channel-forming region.

Namely, when viewing the present invention more broadly from another viewpoint, the present semiconductor memory device is a semiconductor memory device having a plurality of memory elements provided with a source region, a channel-forming region in contact with the source region, an intermediate layer in contact with the channel-forming region, by the intermediate layer and including the charge storing means, and a gate electrode insulated from the channel-forming region, characterized in that an inverse biasing means is provided for inversely biasing the source region with respect to the channel-forming region when the selection signal is not applied to the gate electrode of the memory element. This inverse biasing means may also be provided so as to selectively inversely bias the sources of the memory transistors of the nonselected columns.

The present invention is particularly preferred for a memory element for which "data must be written up to the depletion mode" since the charge storing means does not have conductivity or has an extremely small conductivity (for example, an MONOS type, MNOS type, fine particle size conductor type, ferroelectric type, and DRAM type of the same).

Namely, another characteristic is that the charge storing means in this case does not have conductivity as the entire surface facing the channel-forming region at least when there is no movement of the charges with respect to an external portion.

BRIEF DESCRIPTION OF THE DRAWINGS

These and other objects and features of the present invention will be explained in further detail with reference to preferred embodiments explained by drawings, in which.

DESCRIPTION OF THE PREFERRED EMBODIMENTS

Figure 1:
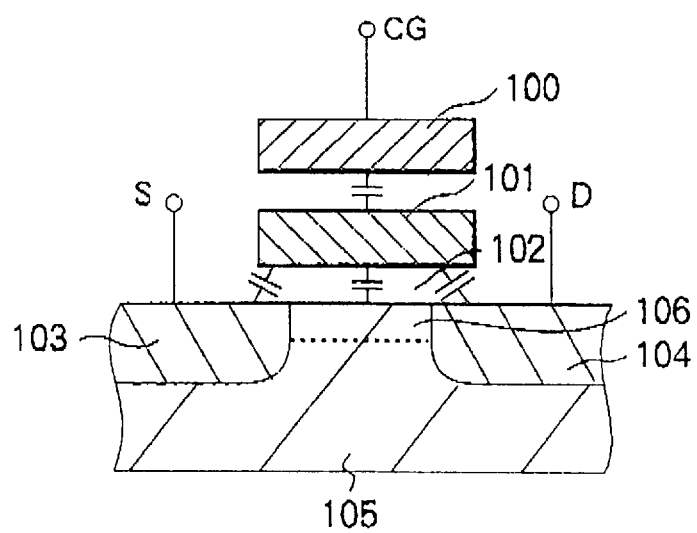
FIG. 1 is a general schematic sectional view of a floating gate type memory transistor.

FIG. 1 is a schematic sectional view of an FG type memory transistor. In the figure, reference numeral 100 denotes a control gate, 101 a floating gate, 102 a gate oxide film, 103 a source region, 104 a drain region, 105 a silicon substrate, and 106 a channel-forming region.

Figure 2:
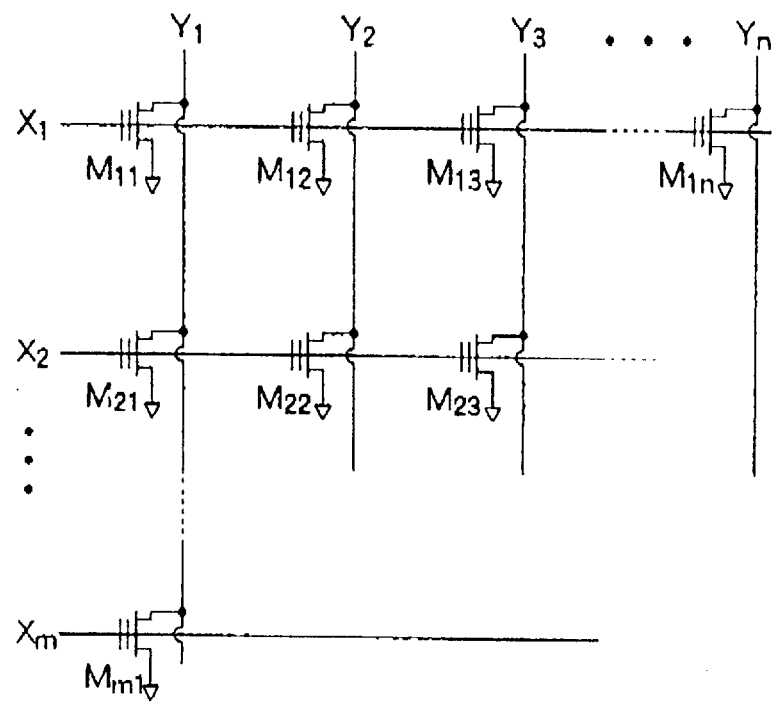
FIG. 2 is a general equivalent circuit diagram of a memory array of a semiconductor memory device.

FIG. 2 is a view of an example of the configuration of a parallel type (NOR type) memory array by the FG type memory transistor shown in FIG. 1.

Symbols $Y_1, Y_2, \ldots, Y_n$ denote bit lines, $X_1, X_2, \ldots, X_m$ denote word lines, and $M_{11}, M_{12}, M_{13}, \ldots, M_{1n}, M_{21}, M_{22}, M_{23}, \ldots, M_{m1}, \ldots$ denote FG type memory transistors shown in FIG. 1.

Word lines $X_1, X_2, \ldots, X_m$ intersect with the bit lines $Y_1, Y_2, \ldots, Y_n$, and the FG memory transistors $M_{11}, M_{12}, M_{13}, \ldots, M_{1n}, M_{21}, M_{22}, M_{23}, \ldots, M_{m1}, \ldots$ are arranged at intersecting points on a one to one basis. A control gate 100 of the memory transistor $M_{ij}$ is connected to the word line $X_i$ forming the intersecting point at which each memory transistor $M_{ij}$ (i=1 to m, j=1 to n) is arranged, and a drain region 104 of the memory transistor $M_{ij}$ is connected to the bit line $Y_j$ with the intersecting point. Further, the source region 103 of each memory transistor $M_{ij}$ is grounded.

Below, an explanation will be made of the operations of writing, erasing, and reading the data from the arranged and connected FG type memory transistors having such a configuration taking as an example a case where the memory transistor $M_{11}$ is selected in FIG. 2.

At the time of writing data, for the word line $X_1$ and the bit line $Y_1$ to which the selected memory transistor $M_{11}$ is connected, a high voltage of for example 12 V is applied to the word line $X_1$, and a voltage of for example 6 V is applied to the bit line $Y_1$. Further, a voltage of 0 V is applied to the nonselected word lines $X_2, \ldots, X_m$ and the bit lines $Y_2, \ldots, Y_n$.

Under such a biasing condition, in the selected FG type memory transistor $M_{11}$, a voltage of 6 V is applied between the drain and source, and the high voltage of 12 V is applied to the control gate 100, whereby a channel is formed in the channel-forming region 106. When this channel is formed, a current flows in the direction of the drain region 104 to the source region 103. Electrons flow while being accelerated in a reverse direction to that of the current. Part thereof is most accelerated in a pinch-off region near the drain region 104, become channel hot electrons (CHE), are drawn to the control gate 100 side to which the positive high voltage is applied, exceed the potential barrier of the oxide film, are injected into the floating gate 101 and accumulated. The data is written by this.

When the electrons are injected into the floating gate 101, the threshold voltage Vth of the FG type memory transistor $M_{11}$ rises. At this time, the threshold voltage Vth of the memory transistor $M_{11}$ after the writing of data is controlled according to the level and time of the voltage applied at the time of injection of the electrons.

At the time of erasing data, similar to the writing operation, a voltage of 6 V is applied to the drain region 104 of the selected memory transistor $MH_{11}$, a voltage of 0 V is applied to the source region 103, and reversely from the writing of data, a negative voltage, for example, a voltage of −12 V, is applied to the word line $X_1$.

Under this biasing condition, the data is erased by withdrawing the accumulated charges from the floating gate 101 to the drain region 104 side. Namely, a high voltage (18 V) is applied to an overlapping portion of the floating gate 101 and the drain region 104, therefore a Fowler-Nordheim tunnel current (hereinafter referred to as an "FN tunnel current") flows from the drain region 104 to the floating gate 101 via a thin oxide film in this part and electrons flow in a reverse direction to this and are withdrawn from the floating gate 101.

When the electrons are withdrawn from the floating gate 101, the threshold voltage Vth of the memory transistor $M_{11}$ falls. The degree of the fall thereof becomes small in accordance with the level and time of the voltage applied at the withdrawal of the charge.

By the injection and withdrawal of the charge as described above, in the whole memory array, the threshold voltage Vth of the memory transistor is divided to a distribution corresponding to the data "0" having a lower level than the predetermined reference level and a distribution corresponding to a data "1" having a higher level than this with the predetermined reference level as a boundary.

At the time of reading of data, when the memory transistor $M_{11}$ from which the data should be read is selected, a voltage of for example 5 V is applied to the word line $X_1$ to which this is connected and a pull-up voltage of for example 2 V is applied to the bit line $Y_1$. Further, a voltage of 0 V is applied to the nonselected word lines $X_2, \ldots, X_m$ and the nonselected bit lines $Y_2, \ldots, Y_n$.

Under such a biasing condition, where the electrons are injected into the floating gate 101 in the selected memory transistor $M_{11}$, the threshold voltage Vth belongs to the high level distribution, and data is being written, the transistor $M_{11}$ cannot be made conductive by the applied voltage (5 V) of the control gate 100, a reading current does not flow through the bit line $Y_1$, and the potential of that bit line $Y_1$ is maintained at a pull-up voltage of 2 V as it is.

On the other hand, where the selected memory transistor $M_{11}$ is in an erasing state, the electrons are released from the floating gate thereof, and the threshold voltage Vth belongs to the distribution of the low level, the transistor $MH_{11}$ becomes conductive by the applied voltage (5 V) of the control gate 100 at the time of reading, the reading current flows through the bit line $Y_1$, and the potential thereof falls from the pull-up voltage (2 V) and becomes for example near 0 V.

Accordingly, when the potential of the selected bit line is detected by the sense amplifier, the conductive or nonconductive state of the memory transistor can be detected, whereby the status of "0" or "1" of the stored data can be read out.

The conventional type (FG type) of memory transistor has a relatively large charge storage capacity and therefore is operated in only the enhancement mode. Therefore, as shown in FIG. 2 and previously described, a memory cell having a "1TR structure", that is, provided with only this memory transistor, is generally adopted.

This FG type memory transistor has a first disadvantage that the nonselected transistors easily become conductive by the application of the voltage of the bit lines. This has grown more serious along with the miniaturization of the element. Therefore, an excess current flows through the nonselected memory transistors, and the current consumption at the time of writing is increased.

The increase of the current consumption closely relates to the capacitive coupling in the stacked gate structure. In the memory transistor, as shown in FIG. 1, between the gate 100 and the gate 101 and, between the floating gate 101 and a region among the regions 103, 104, and 106 on the substrate side are connected by parasitic capacitances.

In the nonselected memory transistors, generally, when the control gate 100 and the source region 103 are reduced to the ground potential, a voltage of for example 6 V is applied to the drain region 104, therefore the potential of the floating gate 101 determined by the capacitive coupling with the periphery rises, This acts in the direction to form a channel.

When the dimensions of the element are relatively large, a channel is not always formed depending on the degree of the rise of the potential and so even if the potential does rise, this does not become a problem.

However, when the thickness of the gate oxide film is reduced, the parasitic capacitance rises all at once and the capacitance between the gates 100 and 101 and the capacitance between the floating gate 101 and the channel-forming region 106 tend to fall when the channel length is reduced.

While it is necessary to secure an overlap at the time of charge withdrawal for the capacitance values between the drain region 104 and the floating gate 101 to which 6 V is applied, there are no other downward factors, therefore the capacitance relatively rises along with the miniaturization of the element and, as a result, the potential rise of the floating gate 101 becomes large and the nonselected memory transistors become conductive.

Figure 3:
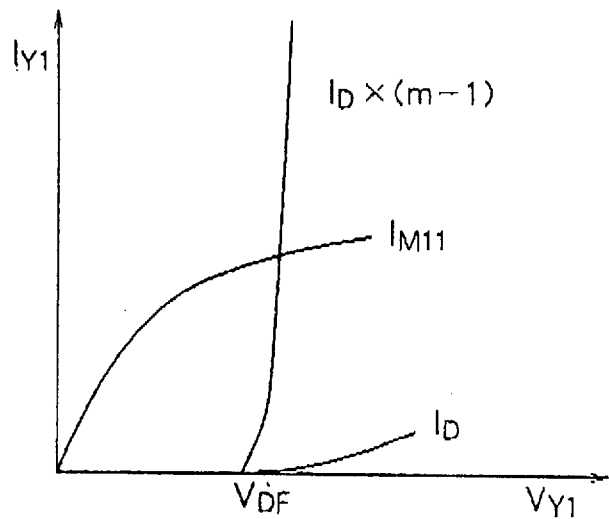
FIG. 3 is a graph showing the relationship of a write current and a bit line voltage of a nonselected cell with respect to the bit line voltage in the semiconductor memory device shown in FIG. 2.
Figure 4:
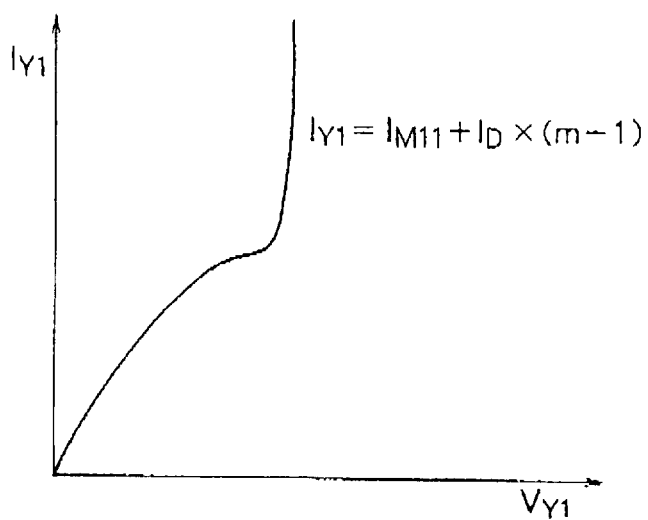
FIG. 4 is a graph showing the relationship of the bit line current at the time of writing with the bit line voltage in the semiconductor memory device shown in FIG. 2.

A more specific explanation will be made of the case where the data is written in the memory transistor $M_{11}$ in for example the memory array shown in FIG. 2. When assuming that the potential of the bit line $Y_1$ is gradually raised from 0 V while applying 12 V to the word line $X_1$ as it is, a write current $I^{M11}$ flows through the selected transistor $M_{11}$ as shown in FIG. 3.

When the bit line $Y_1$ potential is raised to a certain extent, the rise of the potential of the floating gate 101 causes a drain current $I_D$ to start to flow through the nonselected memory transistors as well.

When assuming that all of the transistors $M_{21}, \ldots, M_{m1}$ other than $M_{11}$ among the transistors connected to the bit line $Y_1$ are nonselected, the sum of the drain currents flowing through these nonselected transistors $M_{21}, \ldots, M_{m1}$ becomes remarkably large such as $I_D \times (m-1)$ as illustrated.

For this reason, the current $I_{Y1}$ flowing through the bit line $Y_1$ becomes a current where $I_D \times (m-1)$ is overlapped on the previous write current $I_{M11}$ and this becomes larger as the memory is integrated further. Therefore, both from the viewpoint of a lower power consumption and from the sense that a larger current driving ability of the bit lines becomes necessary, this has become an important disadvantage to be solved.

On the other hand, in general, it is difficult to accurately control the threshold voltage Vth after erasure to within a certain range due to the variation of the memory transistors etc., therefore there is a second disadvantage that part of the erased memory cells end up in the depletion state due to excess erasing etc.

In the example of FIG. 1, when the memory transistor.$M_{11}$ is selected and the stored data thereof is read out, as previously described, for example a voltage of 5 V is applied to the word line $X_1$, a pull-up voltage of 2 V is applied to the bit line $Y_1$, and a voltage of 0 V is applied to the other nonselected word lines $X_2, \ldots, X_m$ and the nonselected bit lines $Y_2, \ldots, Y_n$.

When there is a transistor which enters the depletion state due to excess erasing among the nonselected memory transistors $M_{21}, \ldots, M_{m1}$ connected to the bit line $Y_1$, at the time of reading, irrespective of the fact that a voltage of 0 V is applied to the control gate 100 thereof, a channel is formed and a leakage current flows from the drain region 104 to the source region 103.

If there are many excessively erased memory transistors among the nonselected memory transistors connected to the bit line $Y_1$, the leakage current flowing through the bit line $Y_1$ becomes larger by that amount, the applied pull-up voltage falls, and in certain cases it becomes impossible to detect the threshold voltage Vth of the selected memory transistor $M_{11}$ by the sense amplifier and erroneous reading sometimes occurs.

First Embodiment

Figure 5:
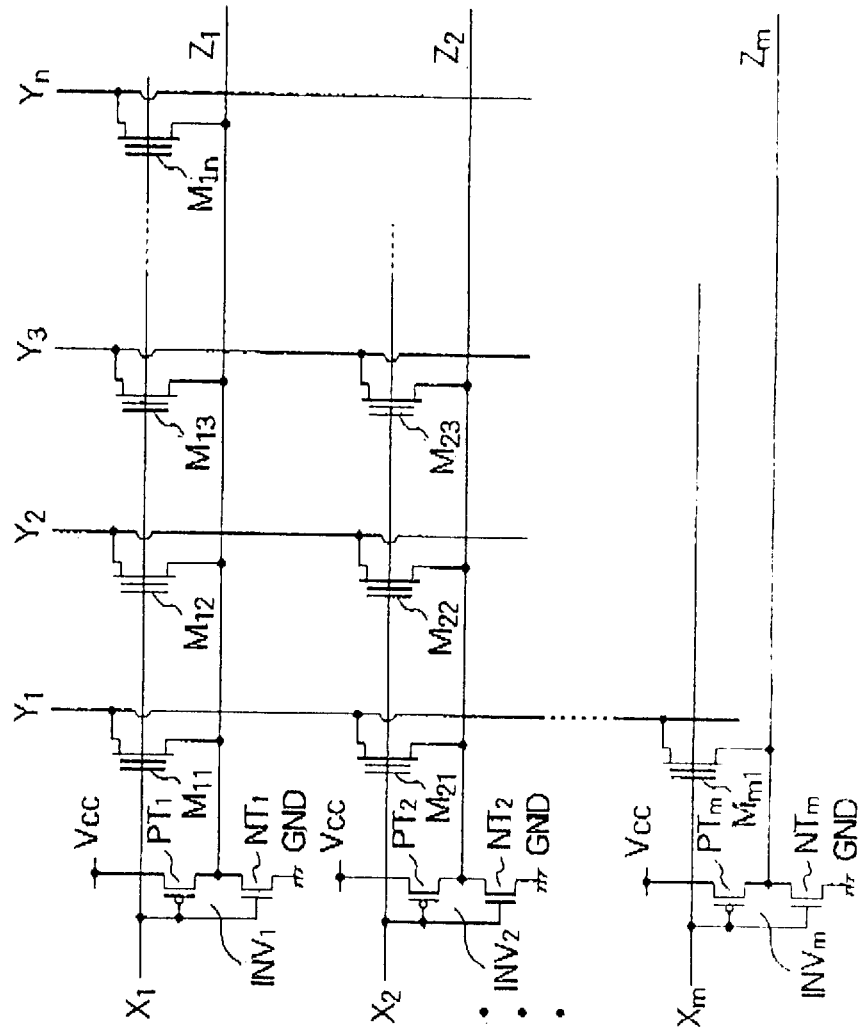
FIG. 5 is an equivalent circuit diagram of a memory array of a semiconductor memory device according to a first embodiment of the present invention.

FIG. 5 is a circuit diagram of a first embodiment of the semiconductor memory device according to the present invention.

Symbols $Y_1, Y_2, \ldots, Y_n$ denote bit lines, $X_1, X_2, \ldots, X_m$ denote word lines, $Z_1, Z_2, \ldots, Z_m$ denote source lines, $M_{11}, M_{12}, M_{13}, \ldots, M_{1n}, M_{21}, M_{22}, M_{23}, \ldots, M_{m1}, \ldots$ denote memory transistors, $INV_1, INV_2, \ldots, INV_m$ denote inverters, $PT_1, PT_2, \ldots, PT_m$ denote p-type MOS transistors, and $NT_1, NT_2, \ldots, NT_m$ denote n-type MOS transistors.

The word lines $X_1, X_2, \ldots, X_m$ and the source lines $Z_1, Z_2, \ldots, Z_m$ are arranged in parallel. These signal lines are arranged so as to intersect the bit lines $Y_1, Y_2, \ldots, Y_n$. The memory transistors $M_{11}, M_{12}, M_{13}, \ldots, M_{m1}, \ldots$ are arranged at intersecting points between these word lines and the bit lines thereby constituting the memory array.

The gates of the memory transistors $M_{11}, M_{12}, M_{13}, \ldots, M_{1n}$ arranged in the same row are connected to the word line $X_1$, the gates of the memory transistors $M_{21}, M_{22}, M_{23}, \ldots$ arranged in the next row are connected to the word line $X_2$, and similar connections are repeated below.

Similarly, the drains of the memory transistors $M_{11}, M_{21}, \ldots, M_{m1}$ arranged in the same column are connected to the bit line $Y_1$, the drains of the memory transistors $M_{12}, M_{22}, \ldots$ arranged in the next column are connected to the bit line $Y_2$, and similar connections are repeated below.

The sources of the memory transistors $M_{12}, M_{12}, M_{13}, \ldots, M_{1n}$ are connected to the source line $Z_1$, the sources of the memory transistors $M_{21}, M_{22}, M_{23}, \ldots$ of the next row are connected to the source line $Z_2$, and similar connections are repeated below.

The inverters $INV_1, INV_2, \ldots, INV_m$ are constituted by the p-type MOS transistors $PT_1, PT_2, \ldots, PT_m$ and the n-type MOS transistors $NT_1, NT_2, \ldots, NT_m$.

Namely, the gate of the p-type MOS transistor $PT_1$ and the gate of the n-type MOS transistor $NT_1$ are connected, the connecting point constitutes the input terminal of the inverter $INV_1$, the drain of the p-type MOS transistor $PT_1$, and the drain of the n-type MOS transistor $NT_1$, are connected, and the connecting point constitutes the output terminal of the inverter $INV_1$. The source of the p-type MOS transistor $PT_1$, is connected to the supply line of the power source voltage $V_{cc}$, and the source of the n-type MOS transistor $NT_1$ is connected to the ground line.

Similarly, the inverter $INV_2$ is constituted by the next p-type MOS transistor $PT_2$ and the n-type MOS transistor $NT_2$ and connected to the supply line of the power source voltage $V_{cc}$ and the ground line.

The same number of inverters as the number of rows of the memory array are constituted in the same way.

The input terminal of the inverter $INV_1$ is connected to the word line $X_1$ and the output terminal is connected to the source line $Z_1$, the input terminal of the inverter $INV_2$ is connected to the word line $X_2$ and the output terminal is connected to the source line $Z_2$, and the input terminal of the inverter $INV_m$ is connected to the word line $X_m$ and the output terminal is connected to the source line $Z_m$.

In such a connection state, when a voltage of a high level is applied to the word line, the potential of the output terminal of the inverter connected to the word line becomes the low level, for example, the ground potential, and also the source line connected to this is held at the ground potential.

When the voltage of a low level is applied to the word line, the potential of the output terminal of the inverter connected to the word line becomes the high level, for example, the power source voltage $V_{cc}$ level, and also the source line connected to this is raised to the power source voltage $V_{cc}$.

Below, an explanation will be made of the write and read operations by taking as an example a case where the memory transistor $M_{11}$ is selected in the above configuration of the memory array.

At the time of writing, a high voltage of for example 12 V is applied to the word line $X_1$ to which the control gate of the selected memory transistor $M_{11}$ is connected and a voltage of for example 6 V is applied to the bit line $Y_1$ to which the drain thereof is connected. A voltage of 0 V is applied to the nonselected word lines $X_2, \ldots, X_m$ and the nonselected bit lines $Y_2, \ldots, Y_n$.

Under this biasing condition, the high voltage of 12 V is applied to the input terminal of the inverter $INV_1$, and therefore the n-type MOS transistor $NT_1$ becomes the conductive state and the output terminal of the inverter $INV_1$, and the source line $Z_1$ connected to this take the ground potential.

Accordingly, since a high voltage of 12 V is applied to the control gate in a state where a voltage of 6 V is applied between the drain region and source region of the selected memory transistor $M_{11}$, a channel is formed in the channel-forming region, and the current flows from the drain region to the source region. The electrons flow in the reverse direction to that of the current while being accelerated by the electric field and part of the electrons accelerated in the pinch-off region in the vicinity of the drain region become channel hot electrons (CHE) which are drawn by the applied voltage of the control gate, captured by the floating gate, and accumulated.

On the other hand, a voltage of 0 V is applied to the nonselected word lines $X_2, \ldots, X_m$, and a voltage of 0 V is applied to the input terminal of the inverters $INV_2, \ldots, INV_m$ connected to this, therefore the n-type MOS transistors $NT_2, \ldots, NT_m$ become the nonconductive state, and the p-type MOS transistors $PT_2, \ldots, PT_m$ become the conductive state. By this, the source lines $Z_2, \ldots, Z_m$ are pulled up to the power source voltage $V_{cc}$.

When paying attention to the bit line $Y_1$ to which the selected memory transistor $M_{11}$ is connected, a sufficient voltage is not applied between the drain regions and source regions of the nonselected memory transistors $M_{21}, \ldots, M_{m1}$ (for example, if $V_{cc}$=6 V, the applied voltage between the two regions is 0 V). As a result, a current due to the potential rise of the floating gate, the disadvantage of the related art waiting to be solved, is not generated, and an excess current other than the write current does not flow through this bit line $Y_1$.

Subsequently, an explanation will be made of the read operation taking as an example a case where the memory transistor $M_{11}$ is similarly selected.

At the time of reading, a voltage of for example 5 V is applied to the word line $X_1$ to which the control gate of the memory transistor $M_{11}$ is connected, and a pull-up voltage of for example 2 V is applied to the bit line $Y_1$ to which the drain thereof is connected. A voltage of 0 V is applied to the nonselected word lines $X_2, \ldots, X_m$ and the nonselected bit lines $Y_2, \ldots, Y_n$.

Accordingly, substantially similarly to the time of writing, a high voltage of 5 V is applied to the input terminal of the inverter $INV_1$, and the output terminal thereof and the source line $Z_1$ take the ground potential.

In the other inverters $INV_2, \ldots, INV_m$, the relationship of the potential is reverse to that of the inverter $INV_1$, and the source lines $Z_2, \ldots, Z_m$ are pulled up to the power source voltage $V_{cc}$.

In this way, in a state where a voltage of 0 V is applied to the control gate of the nonselected memory transistors $M_{21}, \ldots, M_{m1}$ and a pull-up voltage of 2 V is applied to the drain, the source is pulled up to the power source voltage $V_{cc}$, therefore a sufficient voltage is not applied between the drain region and the source region of the nonselected memory transistors $M_{21}, \ldots, M_{m1}$ (for example, if $V_{cc}$=2 V, the applied voltage between the two regions is 0 V).

Even if there is a memory transistor in the depletion state due to the excessive erasing, it does not become a conductive state and as a result there is no leakage path of the read current by the nonselected memory transistors and the current flowing through the bit line $Y_1$ at the time of reading is purely determined by only the drain current of the memory transistor $M_{11}$.

In a case where data is written in the selected memory transistor $M_{11}$, electrons are injected into the floating gate thereof, and the threshold voltage Vth has become higher than the predetermined reference level (usually, about 5 V), the memory transistor $M_{11}$ becomes the nonconductive state as it is, the read current does not flow through the bit line $Y_1$, and the pull-up voltage of 2 V applied to the drain region is held as it is.

Contrary to this, where the selected memory transistor $M_{11}$ is in the erasing state, the electrons are released from the floating gate thereof and the threshold voltage Vth is lower than the reference level, therefore the memory transistor $M_{11}$ becomes the conductive state, the read current flows from the drain region to the source region, and as a result the bit line $Y_1$ potential becomes near for example 0 V since the pull-up voltage falls.

In accordance with the writing or erasing state of the memory transistor selected in this way, the potential of the selected bit line changes, therefore by detecting the change of the potential by the sense amplifier, it can be read out whether the written data is "0".

According to the present embodiment, at the time of writing, the source lines other than the source line $Z_1$ to which the selected memory transistor $M_{11}$ is connected are raised to the power source voltage $V_{cc}$, therefore a large current does not flow through the bit line $Y_1$ selected due to the rise of the potential of the floating gate of the nonselected memory transistor, the disadvantage of related art, and the current consumption at the time of writing can be suppressed to the minimum level.

By the same principle, at the time of reading, the source lines other than the selected source line $Z_1$ are held at the power source voltage $V_{cc}$, the leakage current due to the excessive erasing of a nonselected memory cell can be suppressed, and as a result erroneous reading can be effectively prevented.

Second Embodiment

Figure 6:
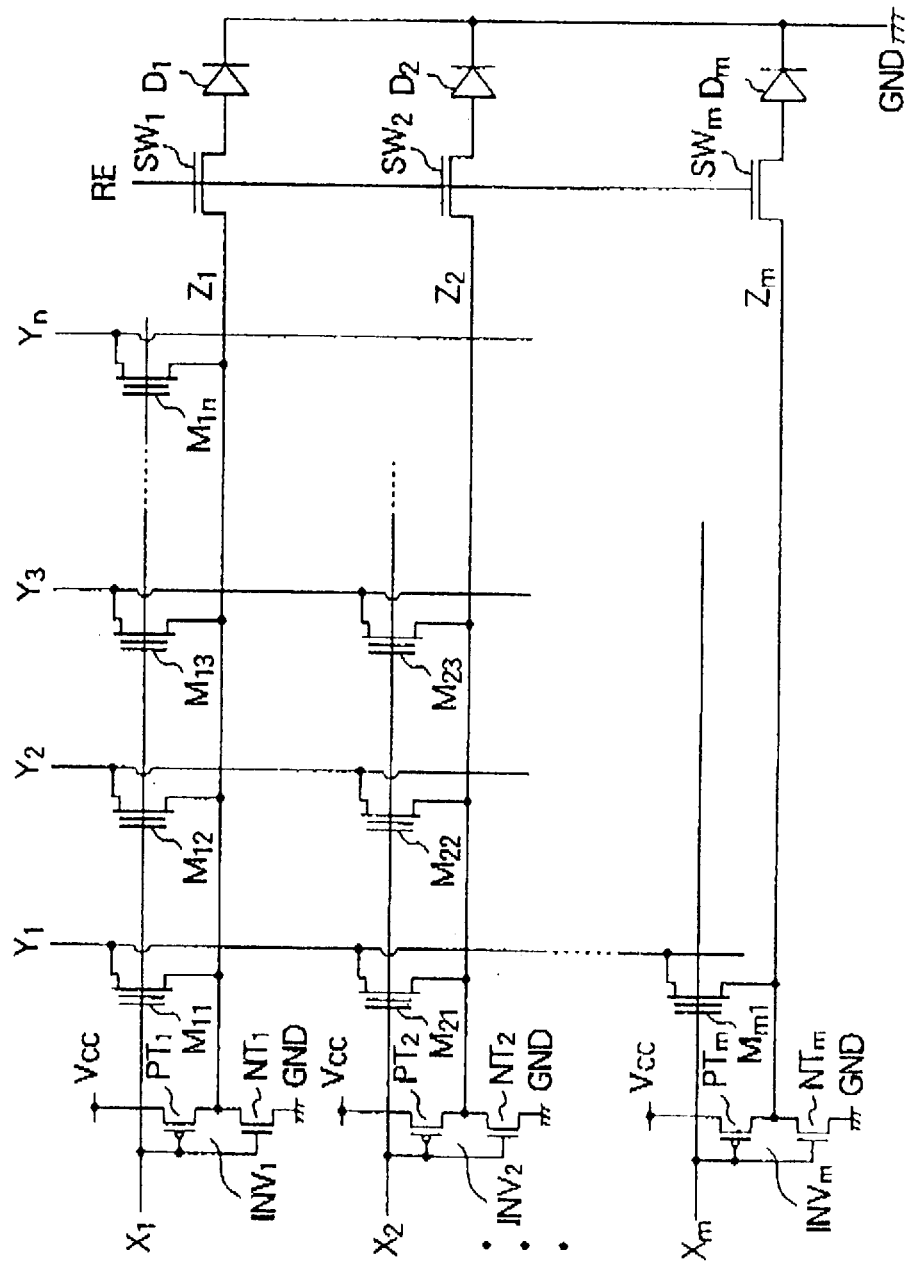
FIG. 6 is an equivalent circuit diagram of a memory array of a semiconductor memory device according to a second embodiment of the present invention.

FIG. 6 is a circuit diagram of a second embodiment of the semiconductor memory device according to the present invention. The fundamental configuration of the present embodiment is the same as that of the first embodiment, the same symbols or numerals are given to overlapping structures, and explanations thereof will be omitted.

In the memory array of the present embodiment, to the source lines $Z_1, Z_2, \ldots, Z_m$ have the switching transistors $SW_1, SW_2, \ldots, SW_m$ and the diodes $D_1, D_2, \ldots, D_m$ connected in series to the ends opposite to the ends to which the inverters are connected in the first embodiment thereof. The gates of the switching transistors $SW_1, SW_2, \ldots, SW_m$ are connected to the reading control line RE, and the cathodes of the diodes $D_1, D_2, \ldots, D_m$ are connected to the ground line.

The switching transistors $SW_1, SW_2, \ldots, SW_m$ are constituted by for example n-type MOS transistors, a signal of high level is applied to the reading control line RE only when the read operation is carried out with respect to the memory array by the control line RE connected to the gates of these MOS transistors, and the switching transistors $SW_1$, $SW_2, \ldots, SW_m$ are set up in the conductive state.

The diodes $D_1, D_2, \ldots,$ are constituted by for example the junction type diodes, and where these diodes are biased in the forward direction, a constant voltage drop will always occur in the PN junction of the diode.

In such a connection state, when the switching transistors $SW_1, SW_2, \ldots, SW_m$ have become the conductive state, the source lines $Z_1, Z_2, \ldots, Z_m$ are always held at the potential corresponding to the voltage drop caused by the diodes $D_1$, $D_2, \ldots, D_m$. When the switching transistors $SW_1, SW_2, \ldots, SW_m$ are in the nonselected state, the potential of the source lines $Z_1, z_2, \ldots, Z_m$ is determined according to the state of the inverter to which the source lines are connected— explained in detail in the first embodiment.

Below, an explanation will be made of the write and read operation in such a configuration of a memory array. The basic operations at the time of writing and at the time of reading are similar to those of the first embodiment previously mentioned, therefore the explanation will be made taking as an example a case where the memory transistor $M_{11}$ is selected and focusing on the different operations from that of the first embodiment. It is assumed that also the biasing conditions other than the source line are the same as those of the first embodiment.

At this writing, a signal of a low level is applied to the reading control line RE, and all of the switching transistors $SW_1, SW_2, \ldots, SW_m$ enter a nonconductive state.

As described above, the potential of the source lines $Z_1$, $Z_2, \ldots, Z_m$ is determined according to the state of the inverters to which the source lines are connected and mentioned in detail in the first embodiment. Namely, the source line $Z_1$ to which the selected word line $X_1$ is connected via the inverter $INV_1$ is dropped to the ground potential, and the nonselected source lines $Z_2, \ldots, Z_m$ other than this are pulled up to the power source voltage $V_{cc}$.

That is, the biasing state of this source line is the same as that of the case of the first embodiment, and therefore also the write operation with respect to the memory array is the same as that in the first embodiment.

The operation of the semiconductor memory device according to the second embodiment greatly differs from the first embodiment in the read operation of the memory cell.

At the time of reading, a signal of a high level is applied to the reading control line RE, and all of the switching transistors $SW_1, SW_2, \ldots, SW_m$ are set in the conductive state.

A voltage of 5 V is applied to the input terminal of the inverter $INV_1$ by the selected word line $X_1$, and therefore the n-type MOS transistor $NT_1$ constituting the inverter $INV_1$ becomes the conductive state and the source line $Z_1$ connected to the output terminal of the inverter $INV_1$ is grounded. Even if the switching transistor $SW_1$ is conductive, a bias is not applied to the PN junction of the diode $D_1$, and the source line $Z_1$ is at the ground potential as it is.

Contrary to this, on the nonselected word line side, the potential relationship becomes reverse to that of the selected word line $X_1$, the source lines $Z_2, \ldots, Z_m$ are connected to the power source voltage $V_{cc}$ side, and in addition the switching transistors $SW_2, \ldots, SW_m$ are open, therefore the diodes $D_2, \ldots, D_m$ are biased in the forward direction and the current flows, and a constant voltage drop occurs in the PN junction of these diodes. Accordingly, the source lines $Z_2, \ldots, Z_m$ are held at the constant potential.

In this way, by the action of the inverters $INV_1, \ldots, INV_m$ and the diodes $D_2, \ldots, D_m$, even if the characteristic of the nonselected memory transistors $M_{21}, \ldots, M_{m1}$ (for example, the threshold voltage Vth) varies in the memory array, in the present embodiment, the optimum bias can be set at the time of writing and reading, therefore the increase of the current at the time of writing and the erroneous operation at the time of reading can be effectively prevented.

Further, according to the present embodiment, the source line is grounded via the switching transistor which becomes conductive only at the time of reading and a diode as the constant potential drop means, therefore the source line to which the memory cell selected at the time of reading is connected is smoothly pulled down to the ground potential, and there is the effect that the deterioration of the operation speed at the time of reading can be prevented.

Third Embodiment

Figure 7:
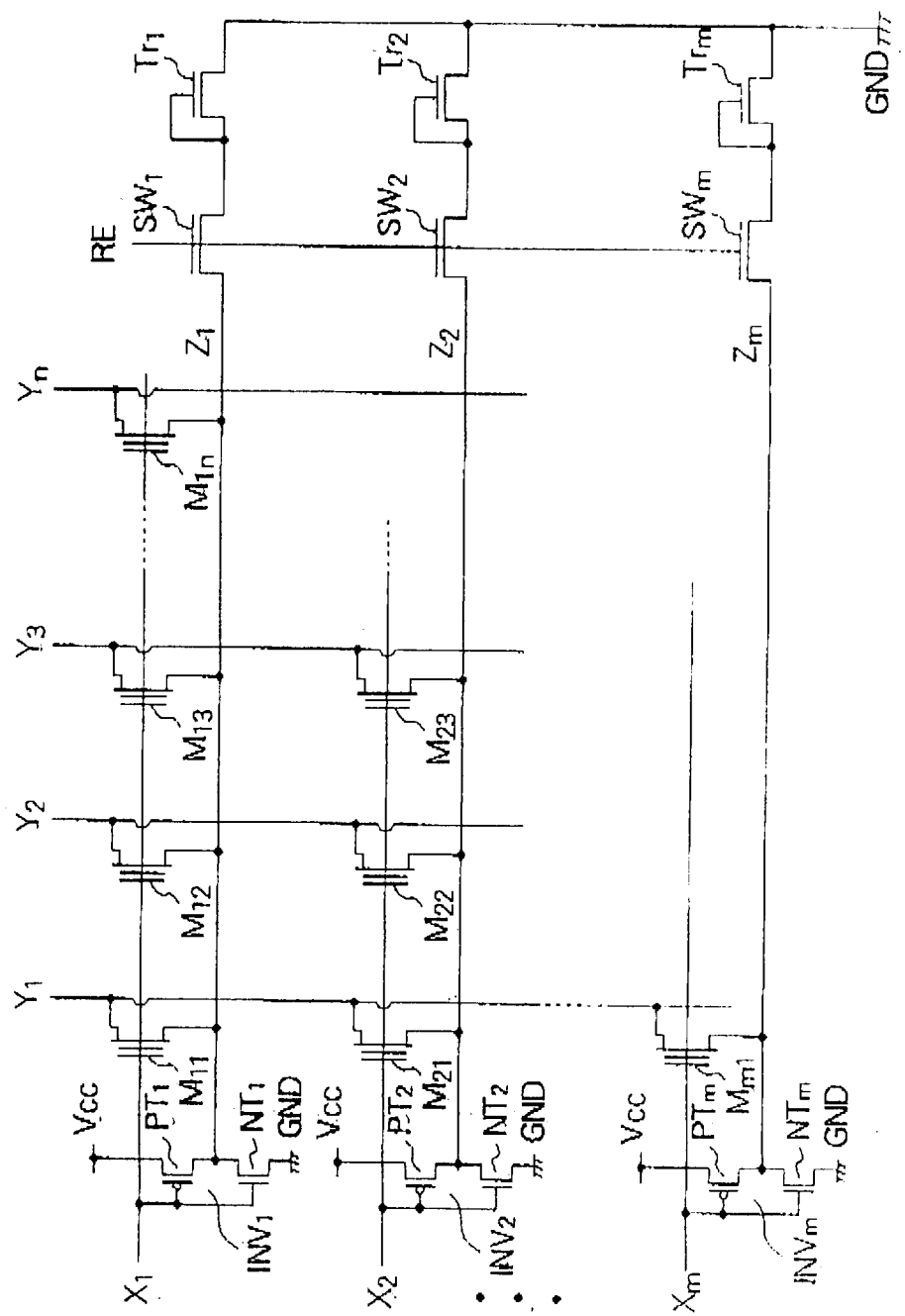
FIG. 7 is an equivalent circuit diagram of a memory array of a semiconductor memory device according to a third embodiment of the present invention.

FIG. 7 is a circuit diagram of the third embodiment of the semiconductor memory device according to the present invention.

Note that, in the present embodiment, in comparison with the second embodiment shown in FIG. 6, the arrangement of memory cells is similar, and only the configuration of the source line to which the source of the memory cell is connected is different. The same symbols or numerals are attached to the structures overlapping those of the first embodiment and the second embodiment, and an explanation thereof will be omitted.

In the present embodiment, in place of the diodes $D_1$, $D_2, \ldots, D_m$ of the second embodiment, the diode-connected n-type MOS transistors $T_{r1}, T_{r2}, \ldots, T_{rm}$ are connected to the source lines. The action of these n-type MOS transistors $T_{r1}, T_{r2}, \ldots, T_{rm}$ are the same as that of the diodes $D_1, D_2, \ldots, D_m$ of the second embodiment.

In the above configuration, the write and read operations in the embodiment are substantially the same as the operations of the second embodiment. A detailed explanation will therefore be omitted.

Also the effects exhibited by the present embodiment are substantially the same as those of the second embodiment.

Namely, other than the fact that the current consumption at the time of writing can be reduced and the erroneous reading due to the leakage current at the time of reading can be effectively prevented, there is an effect that the source line to which the source region of the selected memory transistor is connected is smoothly pulled down to the ground potential at the time of reading, and the deterioration of the operation speed at the time of reading can be prevented.

Fourth Embodiment

In the first to third embodiments, the source lines to which the source regions of the memory transistors were connected were raised in potential by utilizing the inverse signal of the word line signal.

In this case, not limited to FIG. 5 to FIG. 7, it is also possible to arrange the wiring of the source line in the direction of the bit line, not in the parallel direction, to the word line. However, the following case can be considered: if the source line is arranged in the bit line direction, in actuality, it is necessary to arrange the inverter at some locations in the memory array in which the same pattern is repeated, a useless space is formed in the memory array by this, and an efficient pattern design becomes difficult.

The present fourth embodiment essentially and widely covers the present invention and indicates that unnecessary limitations are not always required.

Figure 8:
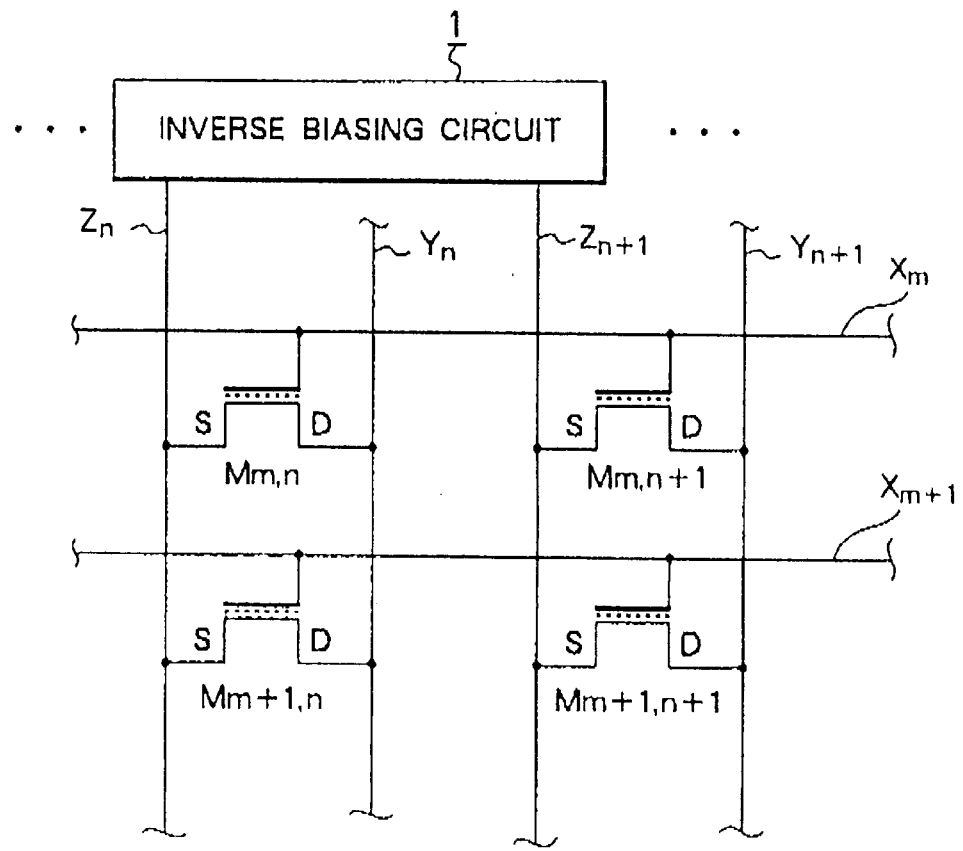
FIG. 8 is an equivalent circuit diagram of a memory array of a semiconductor memory device according to a fourth embodiment of the present invention.

FIG. 8 is a circuit and block diagram of the semiconductor memory device of the present embodiment.

The word lines $X_m$ and $X_{m+1}$ intersect with the bit lines $Y_n$ and $Y_{n+1}$, and memory transistors $M_{m,n}, M_{m+1,n}, M_{m,n+1}$ and $M_{m+1,n+1}$ are arranged at the intersecting points one by one. Then, the word lines exhibiting the intersecting points at which the memory transistors $M_{m,n}, M_{m+1,n}, M_{m,n+1}$ and $M_{m+1,n+1}$ are arranged, the gates of the memory transistors are connected, and to the bit lines exhibiting the intersecting points are connected the drain regions of the memory transistors.

The source lines $Z_n$ and $Z_{n+1}$ are arranged in a direction substantially parallel to the bit lines $Y_n$ and $Y_{n+1}$. By the source lines $Z_n$ and $Z_{n+1}$, the source regions thereof are connected for the memory transistors adjoining each other in the column direction (for example, $M_{m,n}$ and $M_{m+1,n}$, and $M_{m,n+1}$ and $M_{m+1,n+1}$).

In FIG. 8, the connection configuration of four memory transistors was shown, but in actuality a larger number of memory transistors are repeatedly arranged in the form of a matrix with a similar connection configuration.

In the present embodiment, an inverse bias circuit 1 is connected to these source lines $Z_n$ and $Z_{n+1}$. By this inverse bias circuit 1, as will be mentioned later, the source regions are inversely biased with respect to the channel-forming regions of the memory transistors $M_{m,n}, M_{m+1,n}, M_{m,n+1}$, and $M_{m+1,n+1}$.

Figure 9:
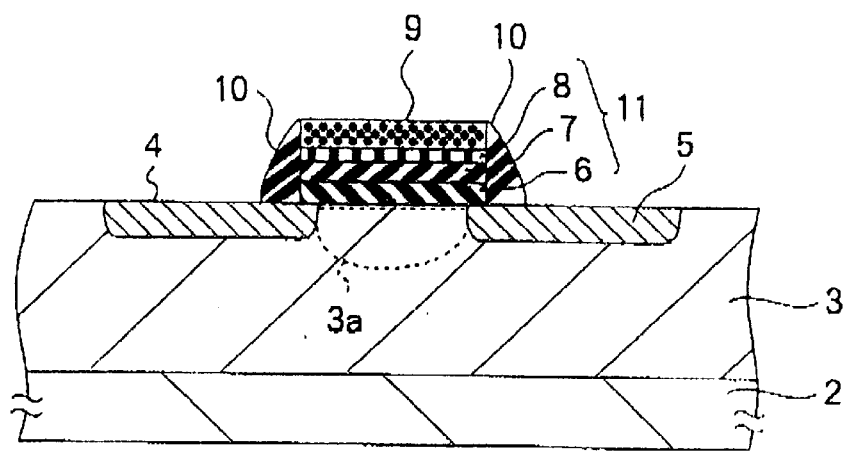
FIG. 9 is a sectional structural view of a memory transistor constituting part of the memory array of FIG. 8.

FIG. 9 is a schematic sectional structural view of an MONOS type EEPROM as one example of the memory transistors $M_{m,n}, M_{m+1,n}, M_{m,n+1}$, and $M_{m+1,n+1}$. A numeral 2 denotes a semiconductor substrate constituted by a silicon wafer or the like, 3 a p-well into which p-type impurities are introduced, 4 a source region into which n-type impurities are introduced with a relatively high concentration, 5 a drain region into which the n-type impurities are similarly introduced with a relatively high concentration, 6 a gate insulating film composed by the silicon oxide or the like, 7 an intermediate nitride film composed by the silicon nitride or the like, 8 a top oxide film composed by the silicon oxide or the like, 9 a gate electrode, and 10 a side wall. Further, 3a is a channel-forming region of the p-well 3, particularly exhibiting the surface part sandwiched between the source region 4 and the drain region 5. Note that, in the figure, the interconnection layers etc. stacked via the inter-layer insulating film are omitted.

In this MONOS type EEPROM, the "intermediate layer" of the present invention is constituted by the gate insulating film 6, the intermediate nitride film 7, and the top oxide film 8. Further, since the charges are trapped in the intermediate nitride film 7 or at the interface between the interior of the intermediate nitride film 7 and the top oxide film 8, the "charge storing means" of the present invention is constituted by these intermediate nitride film 7 and the top oxide film 8.

In this way, in the MONOS type EEPROM, the charge storing means is constituted by the insulating film and the charge traps thereof are limited, therefore the amount of charge which can be stored is limited, and in general, the charge storage is small in comparison with the FG type using the conductive type electrode. As a result, in order to write and read binary stored data, it is necessary to use a larger shift of the threshold value Vth, therefore the writing is carried out up to the depletion mode.

Below, the mode of operation of the inverse bias circuit 1 of the present invention will be explained.

In general, when the source region of a transistor is inversely biased with respect to the channel-forming region (namely, the pn junction between the channel-forming region and the source region is inversely biased), the gate threshold voltage Vth seen from the source region changes in the enhancement direction.

Concretely explaining this in FIG. 9, since the channel-forming region 3a is the p-type and the source region 4 is the n-type, the inverse biasing of them means that the potential of for example the source region 4 is made relatively high or the potential of the channel-forming region 3a is made relatively low, but the threshold voltage Vth will change to high by such an inverse bias.

When the coefficient of this change is defined as $\gamma$, in the case of a voltage Vs of the source region with the channel-forming region serving as the reference, the gate threshold voltage Vth can be represented as in the following equation (1):

$$Vth = Vth(0) + Vs + \gamma Vs^x \qquad (1)$$

Here, Vth(0) is the gate threshold voltage where the potential of the source region is set to 0 V, $\gamma Vs^x$ is a term indicating the substrate effect, and x is a coefficient near ½.

When the Vth(0) is depletion (negative with respect to the n-type channel), if Vs satisfying the following equation (2) is applied between the channel-forming region and the source region, the gate threshold voltage Vth seen from the channel-forming region becomes enhancement (positive with respect to the n-type channel).

$$|Vth(0)| < Vs + \gamma Vs^x \qquad (2)$$

Namely, in FIG. 9, even in a case where the gate threshold voltage Vth(0) when the potential of the source region 4 is set at 0 V is negative and it is a depletion transistor, by applying Vs satisfying the above equation (2) to the source region 4 with the channel-forming region 3a as the reference or applying −Vs to the channel-forming region 3a with the source region 4 as the reference, the depletion transistor can be shifted to the enhancement operation mode.

In the inverse bias circuit 1 illustrated in FIG. 8, it is assumed that a predetermined positive voltage is applied to the source line to which the nonselected memory transistors among the memory transistors $M_{m,n}$, $M_{m+1,n}$, $M_{m,n+1}$, and $M_{m+1,n+1}$ are connected.

This applied voltage is set to a value that is relatively applied Vs to the source region 4 with the channel-forming region 3a as the reference as mentioned above. For example, if assuming it is possible to apply the voltage substantially uniformly in the p-well 3 and that the voltage drop of the source line can be ignored, the applied voltage becomes the fixed potential of the p-well 3 plus Vs.

Figure 10:
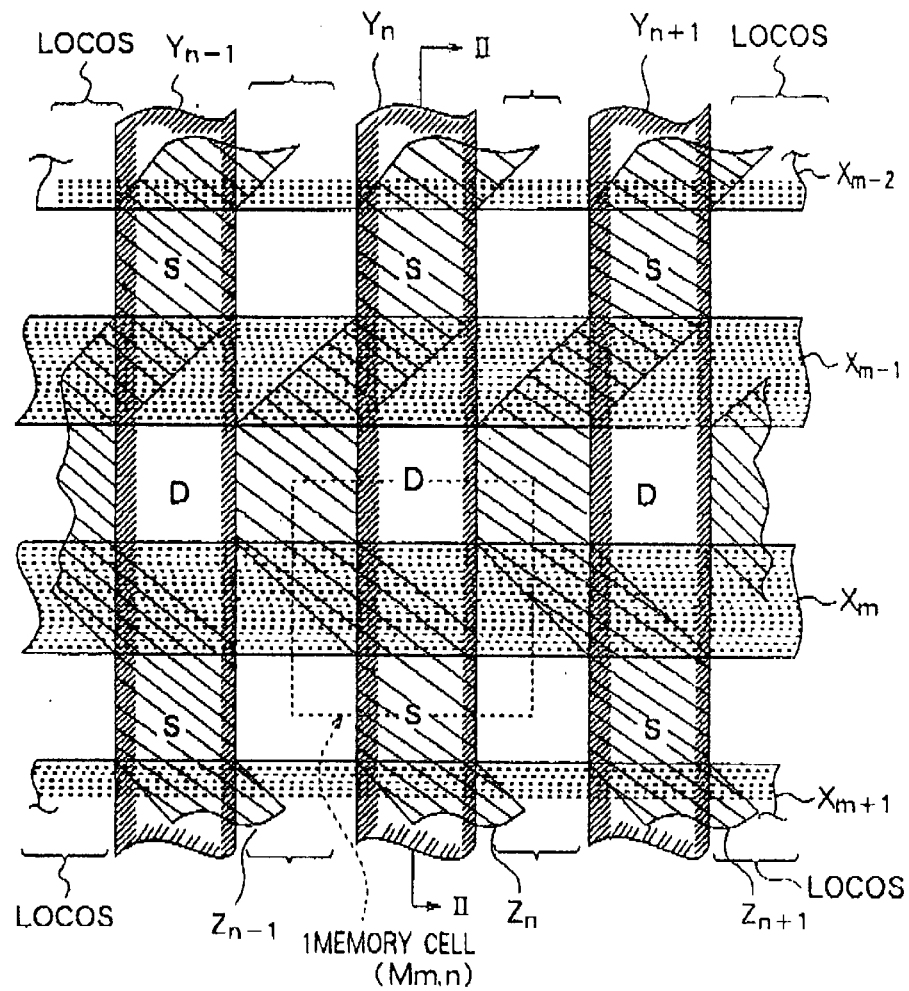
FIG. 10 is a diagram showing a pattern of the memory array of a semiconductor memory device according to a fourth embodiment of the present invention shown in FIG. 8 by a plan view thereof.
Figure 11:
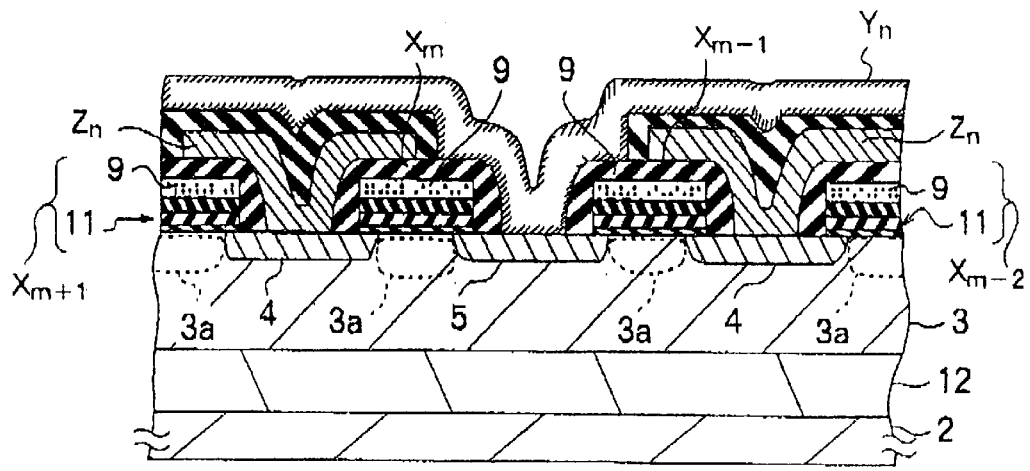
FIG. 11 is a sectional structural view along a line II—II of FIG. 10.
Figure 12:
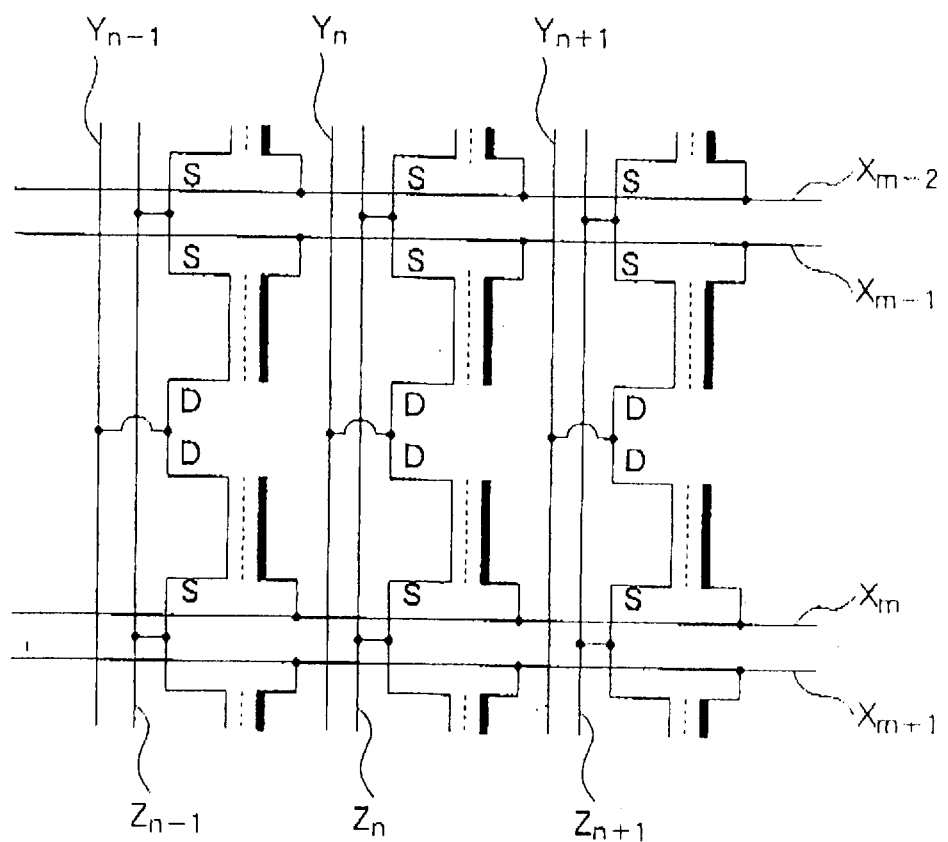
FIG. 12 is an equivalent circuit diagram of the memory array of FIG. 10.

FIG. 10 is a plan view of a memory cell showing a specific example of the design of a cell pattern. FIG. 11 is a schematic sectional view along the line II—II of FIG. 10. FIG. 12 is an equivalent circuit diagram of the memory array of FIG. 10.

As shown in FIG. 10, in the p-type semiconductor substrate 2 is formed a reverse conductivity type n-well 12 in which is formed the above p-well 3.

In the cell pattern of FIG. 10, first, while not appearing in FIG. 11, a longitudinal strip-like LOCOS is arranged at equal intervals on the surface of the p-well 3. Due to this, an active region is formed in the LOCOS intervals.

The word lines $X_{m-2}$, $X_{m-1}$, $X_m$, $X_{m+1}$ are arranged at equal intervals so as to intersect the active regions. The word lines, as shown in FIG. 9 and explained earlier, are configured by a stacked film comprised, from the bottom layer, of the gate oxide film 6, intermediate nitride film 7, top oxide film, and gate electrode 9.

In the active regions in the intervals of the word lines $X_{m-2}$, $X_{m-1}$, $X_m$, $X_{m+1}$ are introduced n-type impurities at a high concentration to alternately form the source regions 4 and drain regions 5.

The source regions 4 and drain regions 5 have a size limited only by the intervals between LOCOS' in the lateral direction of FIG. 10 and limited only by the interval between word lines in the longitudinal direction of FIG. 10. Accordingly, when it comes to the size and variation of arrangement of the source regions 4 and drain regions 5, these regions can be formed extremely uniformly since there is almost no error of mask alignment introduced.

The areas around the word lines $X_{m-2}$, $X_{m-1}$, $X_m$, $X_{m+1}$ are covered by the side walls and first inter-layer insulating film.

By just forming the side walls, the contact holes for the connection of bit lines and the contact holes for the connection of the source lines can be formed at the source regions 4 and drain regions 5 without the use of a mask and further simultaneously using the two dimensional self-alignment contact technique wherein the self-alignment contact is employed in the lateral direction and the longitudinal direction perpendicular to the lateral direction. Accordingly, as previously mentioned, the size and the arrangement of the source regions 4 and the drain regions 5 are uniform and in addition also the size of the contact holes formed by the two-dimensional self-alignment technique with respect to this is extremely uniform and has almost the maximum size with respect to the surface area of the source region 4 and the drain region 5.

The source lines $Z_{n-1}$, $Z_n$, and $Z_{n+1}$ arranged on this are arranged in a zigzag manner on the LOCOS and the source regions 4 while avoiding the drain regions 5 and are connected to the source regions 4 via the contact holes for the connection of the source lines.

Further, on this, the bit lines $Y_{n-1}$, $Y_n$, and $Y_{n+1}$ are arranged at equal intervals via the second inter-layer insulating film. These bit lines $Y_{n-1}$, $Y_n$, and $Y_{n+1}$ are located above the active region and connected to the drain regions 5 via the contact holes for the bit line connection.

In this cell pattern, as described above, the formation of the source region 4 and the drain region 5 is not affected the mask-alignment, and the contact holes for the bit line connection and the contact holes for the source line connection are formed by using self-alignment technology twice together. Therefore, the contact holes do not become elements restricting the reduction of the cell surface area, the source lines etc. can be wired with the minimum line width f of the wafer process limit, and in addition, there is almost no useless space (even LOCOS width is necessary as the "retreat width" of the source lines), therefore a small cell surface area near $(1+2^{1/2})^2 f^2$ (f is the minimum line width) can be realized.

For a memory array having such a configuration, the writing, erasing, and reading operations are basically the same as the case of the first embodiment except that the writing is performed up to the depletion mode.

Note, in a case where the charge storing layer does not have conductivity or has an extremely small conductivity as in the present embodiment, there can be almost no movement of the charges within the charge storing layer, accordingly on the entire surface of the channel-forming surface, the injection and withdrawal of the charges are carried out by the FN tunneling (or direct tunneling).

Below, a simple explanation will be made of the write, erasing, and read operations carried out by using the inverse bias circuit 1 of FIG. 8 with respect to this cell pattern by taking as an example a case where the memory transistor $M_{m,n}$ is selected.

At the time of writing, a voltage of 0 V is applied to the p-well 3 and the n-well 12. Further, for the nonselected memory transistors, a voltage of 3 V is applied to the bit lines and the source lines thereof.

In this state, for the selected memory transistor $M_{m,n}$, a power source voltage $V_{DD}^+$ (about 9 V) is applied to the word line $X_m$ (gate electrode 9) thereof, and a voltage of 0 V is applied to the bit line $Y_n$ (drain region and the source line $Z_n$.

Under this biasing condition, charges (electrons in this case) are injected into the charge storing layers 7 and 8 via the gate oxide film 11 and stored in the charge traps thereof.

By this, the gate threshold voltage Vth of the selected memory transistor $M_{m,n}$ takes the gate threshold voltage $Vth^+$ (hereinafter, referred to as an enhancement Vth) on the high distribution side and becomes for example about 1 V.

The erasing is carried out in units of for example blocks together.

Namely, for all of the cells of the block, 0 V voltage is applied to the word lines (gate electrodes 9) of the same, and the power source voltage $V_{DD-}$ (about 7 V) is applied to the bit lines (drain region 5) thereof, the p-well 3, and the n-well 12.

The stored charges are withdrawn to the wells 3 and 12 side all at once, and as a result, the gate threshold voltages Vth of all memory transistors become the gate threshold voltage $Vth^-$ on the low distribution side (hereinafter referred to as a depletion Vth) within the cells of the block and the value thereof becomes for example about −1 V.

On the other hand, preceding the reading, a voltage (for example 1.5 V) is applied to all source lines by for example the inverse bias circuit 1 so that the potential of the source region 4 seen from the channel-forming region 3a becomes the predetermined $V_s$.

By the application of this $V_s$, the depletion Vth seen from the channel-forming region 3a has shifted to the enhancement side by about 0.7 to 0.8.

At the time of reading, a voltage of 0 V is applied to the word lines of the nonselected memory cells. For the selected memory transistor $M_{m,n}$, 1.5 to 2.5 V is applied to the word line $X_m$ (gate electrode 9) thereof, and a predetermined low voltage is applied to the bit $Y_n$ (drain region 5) thereof. Further, the potential is switched to the negative side so that only the source line $Z_n$ of the selected memory transistor $M_{m,n}$ becomes the non-bias (for example 0 V) state with respect to the channel-forming region 3a.

Under this biasing condition, in the nonselected memory cell, the depletion Vth seen from the channel-forming region 3a thereof is high, i.e., about 0.7 to 0.8 V, therefore when the memory transistor thereof is in the nonconductive state as it is, the current will not flow from the nonselected cell to the bit line.

On the other hand, in the selected memory cell, the depletion Vth seen from the channel-forming region 3a thereof is about 0.7 to 0.8 V, the enhancement Vth seen from the channel-forming region 3a is 2.7 to 2.8 V, and 1.5 to 2.5 V is applied to the word line $X_m$ thereof (gate electrode 9), therefore a sufficiently large read current flows from the cells written on the depletion side and only a slight current not more than the sub-threshold value current flows from the cells written on the enhancement side.

For the selected cell, a decision of the data "1" or "0" can be clearly carried out.

The present invention is not limited to the above embodiments. Various modifications are possible.

Figure 13:
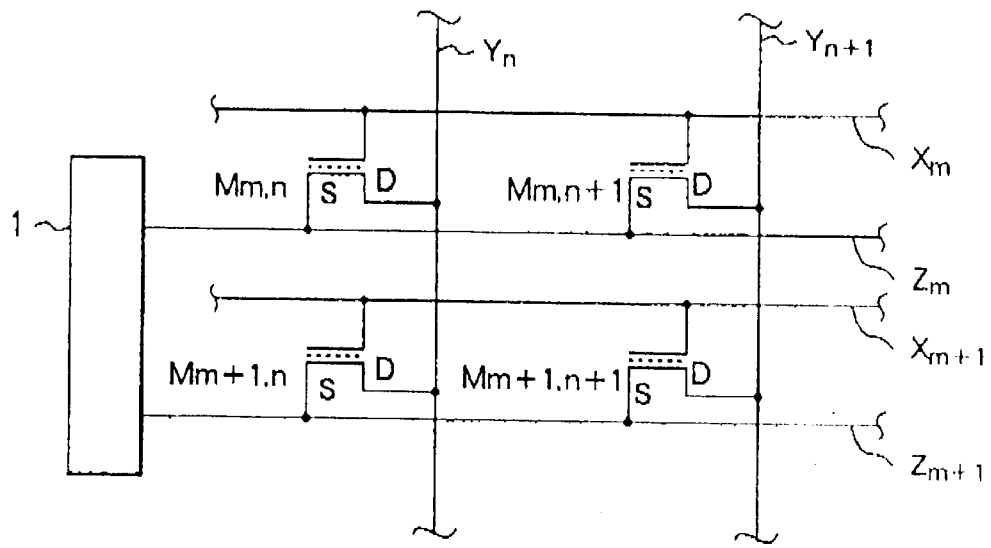
FIG. 13 is an equivalent circuit diagram of a memory array where the source lines are arranged in the word line direction as a modification of FIG. 8;1

For example, as shown in FIG. 13, the source lines is not limited to the direction shown in FIG. 8 and can be laid in parallel to the word lines similar to the first embodiment.

Further, as the type of the transistor which can be used by the present invention, various transistors can be applied so far as they have a charge storing means under the gate electrode and are insulating gate type transistors capable of electrically controlling the charge amount by this gate electrode.

Figure 14:
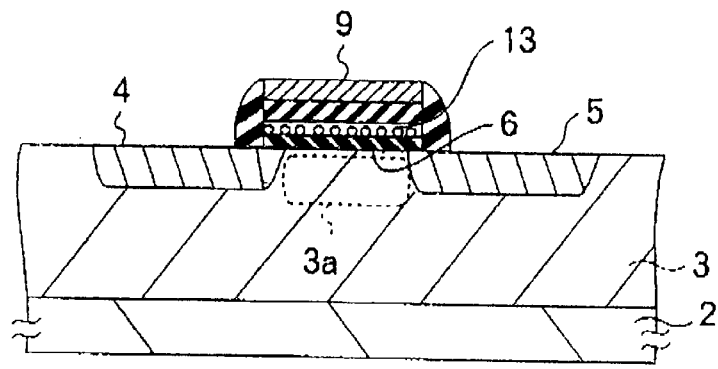
FIG. 14 is a sectional structural view of a transistor obtained by embedding the fine particle size conductors preferred for the present invention in the insulating film.

As shown in FIG. 14, as the charge storing means, there are for example a transistor in which innumerable fine particle size conductors 13 made of silicon are embedded in the insulating film.

Figure 15:
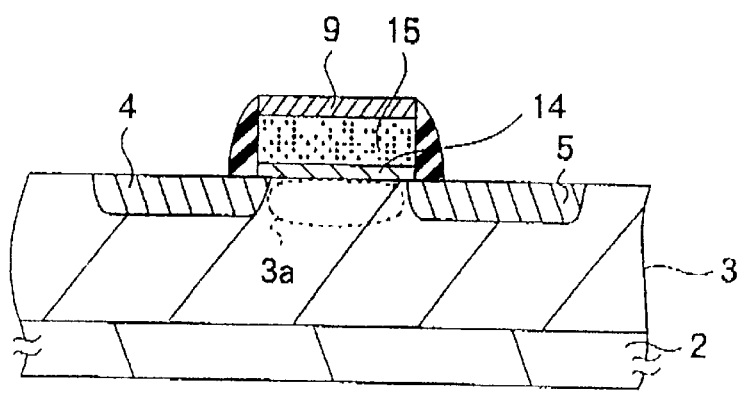
FIG. 15 is a sectional structural view of a transistor using a ferroelectric film for a gate insulating film preferred for the present invention.

Further, as shown in FIG. 15, a transistor having the insulating film 14 as the charge storing means in contact with the top of the channel-forming region 3a and the ferroelectric film 15 located between the insulating film 14 and the gate electrode 9 on the insulating film 14 is preferred.

Note that while the write time is long and they have been conventionally used as ROM use devices, it is also possible to use them as RAM use device such as DRAMs by shortening the writing time by the reduction of thickness of the gate oxide film etc.

In this way, a transistor in which the charge storing means does not have conductivity or has an extremely small conductivity can be mentioned as the particularly preferred type of transistor for the present invention for the following reasons.

The semiconductor memory device and data reading method of the present invention do not always need a circuit for generating a negative voltage in comparison with the conventional method previously mentioned. It is therefore a simple control method.

However where the charge storing means always has conductivity as the entire flat surface facing to the channel-forming region, for example, the floating gate, a voltage due to Vs is applied between the source region and the floating gate, and the charges stored in the floating gate are leaked to the source region due to this voltage, and therefore there is liable to be some weakening of the stored charge at the time of nonselection (disturbance).

In a transistor in which the charge storing means is constituted by insulated innumerable small particle size conductors, a multiple layer insulating film, or an insulating film in which free movement of the charges is limited in accordance with the direction of polarization of the ferroelectric film and thus does not have conductivity as the entire plane facing the channel-forming region or has an extremely small conductivity, the disturbance is especially hard to cause to occur.

This is because, in these charge storing means, the charges cannot freely move in the planar direction and therefore the weakening of the charges is limited to just one part in the vicinity of the source region. In addition, when the source region has a positive potential due to the application of Vs, the negative charges (electrons) in the charge storing means in the vicinity of this tend to be pulled out, therefore the channel facing the charge storing means in the vicinity of the source region becomes the depletion direction and accordingly does not act in the direction reducing the read current, and thus the adverse influence is suppressed to the minimum level.

From the above viewpoints, particularly where the transistor does not have conductivity in the planar direction of the charge storing means or has an extremely small conductivity, it becomes possible to set the applied voltage between the gate electrode and the channel-forming region of the nonselected cells to near 0 V to thereby prevent a gate disturbance of the nonselected cells from occurring and it becomes possible to read the data of the selected cell.

What is claimed is:

1. A semiconductor memory device comprising:

word lines which are arranged in a row direction;

bit lines which are arranged in a column direction while intersecting said word lines;

a plurality of memory elements each having a gate electrode formed on a channel forming region through an insulating layer between a source region and a drain region, said memory elements being arranged in the form of a matrix at intersecting points of said word lines and said bit lines, in which the source regions and the drain regions are formed in said channel forming region and spaced apart from each other; and source lines arranged in the row direction parallel to said word lines and connected to the source regions of said memory elements, wherein said gate electrodes are connected to said word lines;

said drain regions are connected to said bit lines;

and said source lines belonging to nonselected rows are reverse biased with respect to said channel forming region.

2. A semiconductor memory device according to claim 1, wherein said memory element comprises an insulating gate field effect transistor having a floating gate in said insulating layer.

3. A semiconductor memory device comprising:

word lines which are arranged in a row direction:

bit lines which are arranged in a column direction while intersecting said word lines;

a plurality of memory elements each having a gate electrode formed on a channel forming region through an insulating layer between a source region and a drain region, said memory elements being arranged in the form of a matrix at intersecting points of said word lines and said bit lines, in which the source regions and the drain regions are formed in said channel forming region while being spaced apart from each other; and source lines arranged in the column direction orthogonal to said word lines and connected to the source regions of said memory elements, wherein said gate electrodes are connected to said word lines;

said drain regions are connected to said bit lines;

and said source lines belonging to nonselected columns are reverse biased with respect to said channel forming region.

4. A semiconductor memory device according to claim 3, wherein said memory element comprises an insulating gate field effect transistor having a floating gate in said insulating layer.

5. A semiconductor memory device comprising:

word lines which are arranged in a row direction;

bit lines which are arranged in a column direction while intersecting said word lines;

a plurality of memory elements each having a gate electrode formed on a channel forming region through an insulating layer between a source region and a drain region, said memory elements arranged in the form of a matrix at intersecting points of said word lines and said bit lines, in which said gate electrodes are connected to said word lines and said drain regions are connected to said bit lines;

source lines arranged in the row direction parallel to said word lines and connected to the source regions of said memory elements; and a source line driving means for driving said source lines by an inverted signal of said word lines.

6. A semiconductor memory device according to claim 5, wherein said source line driving means comprise an inverter with an input node connected to said word line and an output node connected to said source line.

7. A semiconductor memory device according to claim 8, wherein said constant potential drop means comprise an insulating gate field effect transistor with a source electrode which is grounded, a drain electrode and gate electrode which are connected, and with a connection point thereof connected to said switch means.

8. A semiconductor memory device comprising:

word lines which are arranged in a row direction;

bit lines which are arranged in a column direction while intersecting said word lines;

a plurality of memory elements each having a gate electrode formed on a channel forming region through an insulating layer between a source region and a drain region, said memory elements being arranged in the form of a matrix at intersecting points of said word lines and said bit lines, in which said gate electrodes are connected to said word lines and said drain regions are connected to said bit lines;

source lines arranged in the row direction parallel to said word lines and connected to the source regions of said memory elements, a serial circuit of a switching means and a constant potential drop means connected between said source line and a reference potential for every row of said memory array, which becomes conductive only at the reading of the data; and a source line driving means for driving said source lines by an inverted signal of said word lines.

9. A semiconductor memory device according to claim 8, wherein said source line driving means comprise an inverter with an input node connected to said word line and an output node connected to said source line.

10. A semiconductor memory device according to claim 8, wherein said constant potential drop means comprise a junction type diode.

11. A semiconductor memory device according to claim 8, wherein said constant potential drop means comprise an insulating gate field effect transistor whose gate and drain are commonly connected to said switching means and whose source is connected to a reference potential.

12. A semiconductor memory device according to claim 1, wherein said memory elements comprise an insulating gate field effect transistor having a floating gate.

13. A semiconductor memory device comprising:

word lines;

bit lines intersecting said word lines;

a plurality of source lines; and a plurality of memory elements, said memory elements having at least: a semiconductor channel-forming region; a source region and a drain region spaced apart from each other and contacting said channel-forming region; an intermediate layer on the surface of said channel-forming region sandwiched between said source and drain regions, said intermediate layer comprising at least an insulator and a charge storing means in or on said insulator; and a conductive gate on said intermediate layer;

wherein said conductive gates are connected to said word lines, and said drain regions are connected to said bit lines; said source regions are connected to said source lines, and said source lines are connected to a plurality of reverse bias means, said reverse bias means supplying to said source lines a reverse bias with respect to said channel-forming region.

14. A semiconductor memory device according to claim 13, wherein said charge storing means do not have conductivity over an entire surface area of a surface facing said channel forming region.

15. A semiconductor memory device according to claim 13, wherein said intermediate layer comprises at least one layer of oxide film and nitride film stacked on each other.

16. A semiconductor memory device according to claim 13, wherein said charge storing means comprise fine particulate conductors which are embedded and dispersed in said insulator.

17. A semiconductor memory device according to claim 13, wherein said insulator of said intermediate layer comprises an insulating film on said channel-forming region, and said charge storing means of said intermediate layer comprise a ferroelectric film.

18. A method of reading a semiconductor memory device, where the device comprises:

word lines bit lines;

bit lines intersecting said word lines;

a plurality of source lines;

a plurality of memory elements, said memory elements having at least a semiconductor channel-forming region; a source region and a drain region spaced apart from each other and contacting said channel-forming region; an intermediate layer on a surface of said channel-forming region sandwiched between said source and drain regions, said intermediate layer comprising at least an insulator and a charge storing means in or on said insulator; and a conductive gate on said intermediate layer, said conductive gates are connected to said word lines; said drain regions are connected to said bit lines; and said source regions are connected to said source lines;

the method comprising:

reverse-biasing said source regions with respect to said channel-forming region using said source lines;

applying a read selection signal to at least one of said conductive gates through one of said word lines; and reading as an electric current between said drain and source regions of a memory element an amount of stored charge in a memory element having a conductive gate to which said read selection signal is applied.

19. A method of reading a semiconductor memory device according to claim 18, wherein said applying a read selection signal further comprises equalizing the potential between a source region and a channel forming region of said memory element having a conductive gate to which said read selection signal is being applied prior to said step of reading.

20. A semiconductor memory device comprising:

word lines;

bit lines intersecting said word lines;

a common source line; and a plurality of memory elements, each of said memory elements comprising: a semiconductor channel-forming region; a source region and a drain region spaced apart from each other and contacting said channel-forming region; an intermediate layer on a surface of said channel-forming region sandwiched between said source and drain regions, said intermediate layer comprising an insulator and a charge storing means in or on said insulator; and a conductive gate on said intermediate layer;

wherein said conductive gates are connected to said word lines; said drain regions are connected to said bit lines; said source regions are connected to said common source line; said common source line is connected to a reverse bias means, said reverse bias means supplying to said common source line a reverse bias with respect to said channel-forming region.

21. A method of reading a semiconductor memory device, where the device comprises:

word lines;

bit lines intersecting said word lines;

a common source line;

a plurality of memory elements, each of said memory elements comprising: a semiconductor channel-forming region; a source region and a drain region spaced apart from each other and contacting said channel-forming region; an intermediate layer on a surface of said channel-forming region sandwiched between said source and drain regions, said intermediate layer comprising an insulator and a charge storing means in or on said insulator; and a conductive gate on said intermediate layer;

wherein said conductive gates are connected to said word lines; said drain regions are connected to said bit lines; and said source regions are connected to said common source line;

the method comprising:

reverse-biasing said source regions with respect to said channel-forming region using said source line;

applying a read selection signal to at least one of said conductive gates through one of said word lines; and reading as an electric current between said drain and source regions of a memory element an amount of stored charge in a memory element having a conductive gate to which said read selection signal is applied.

22. A semiconductor memory device comprising:

word lines which are arranged in a row direction;

bit lines which are arranged in a column direction while intersecting said word lines;

a plurality of memory elements each having a gate electrode formed through an insulating layer on a channel forming region between a source region and a drain region, said memory elements being arranged in the form of a matrix at intersecting points of said word lines and said bit lines, wherein the source regions and the drain regions are formed in said channel forming region and spaced apart from each other; and source lines arranged in the row direction parallel to said word lines and connected to the source electrodes of said memory elements, wherein said gate electrodes are connected to said word lines;

said drain electrodes are connected to said bit lines;

and said source lines belonging to nonselected rows are reverse biased with respect to said channel forming region.

* * * * *